United States Patent
Bae et al.

(10) Patent No.: US 8,677,053 B2
(45) Date of Patent: Mar. 18, 2014

(54) NONVOLATILE MEMORY DEVICE AND METHOD FOR OPERATING THE SAME

(75) Inventors: Ji-Hyae Bae, Gyeonggi-do (KR); Kyoung-Wook Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 647 days.

(21) Appl. No.: 12/488,616

(22) Filed: Jun. 22, 2009

(65) Prior Publication Data
US 2010/0281203 A1 Nov. 4, 2010

(30) Foreign Application Priority Data

Apr. 30, 2009 (KR) .......................... 10-2009-0038531

(51) Int. Cl.
*G06F 12/02* (2006.01)
(52) U.S. Cl.
USPC ............ 711/103; 711/E12.001; 711/E12.008; 713/600
(58) Field of Classification Search
USPC ............ 711/103, E12.001, E12.008; 713/600
See application file for complete search history.

(56) References Cited

U.S. PATENT DOCUMENTS

| | | | |
|---|---|---|---|
| 2006/0242527 A1* | 10/2006 | Kwon | 714/746 |
| 2007/0297252 A1* | 12/2007 | Singh | 365/200 |
| 2008/0062772 A1* | 3/2008 | Ko | 365/189.02 |
| 2009/0300439 A1* | 12/2009 | Haywood | 714/718 |

FOREIGN PATENT DOCUMENTS

KR 1020070014470 2/2007

OTHER PUBLICATIONS

Notice of Allowance issued from Korean Intellectual Property Office on Nov. 30, 2010.

* cited by examiner

*Primary Examiner* — Yong Choe
(74) *Attorney, Agent, or Firm* — IP & T Group LLP

(57) ABSTRACT

A nonvolatile memory device includes a selecting unit configured to select one of a read data or a program signal indicating a program period, an output unit configured to output an output signal of the selecting unit to the outside of a chip, and an output pin connected to the output unit.

5 Claims, 4 Drawing Sheets

NONVOLATILE MEMORY DEVICE AND METHOD FOR OPERATING THE SAME

CROSS-REFERENCE TO RELATED APPLICATION

The present invention claims priority of Korean Patent Application No. 10-2009-0038531, filed on Apr. 30, 2009, the disclosure of which is incorporated herein by reference in its entirety.

BACKGROUND OF THE INVENTION

The present invention relates to a nonvolatile memory device, and more particularly, to a nonvolatile memory device capable of accurately measuring time necessary for a program operation, and a method for operating the same.

In the case of nonvolatile memory devices having a relatively long program time or verification scheme, it is difficult to predict a program time because the program time varies in a wide range, as opposed to volatile memory devices such as DRAM. The program operation is to record data in memory cells, and the verification scheme is to verify whether a program is successfully recorded in memory cells.

Nonvolatile memory devices having a relatively long program time of micro second (µs) use a status flag for detecting a program end time. When a memory controller requests a status flag to a memory, the memory responds to the request to send a status flag corresponding to an internal routine status. In this way, it is confirmed whether the program operation inside the nonvolatile memory device is completed.

FIG. 1 is a timing diagram explaining a procedure of confirming whether a program operation is completed in a conventional nonvolatile memory device.

In FIG. 1, CE# is a chip enable signal that is activated to a low level, OE# is a data output enable signal that is activated to a low level when data is outputted from a memory chip. WE# is a data input enable signal that is activated to a low level when data is inputted to a memory chip. ADDR and DQ are an address pin and a data pin, respectively. PGM is a signal that is internally activated during a program operation.

Referring to FIG. 1, a program command is applied. To be specific, the program command is applied through an address pin ADDR and a data pin DQ for three cycles. That is, the first three signals 555$h$, 2AA$h$ and 555$h$ inputted through the address pin ADDR, and the first three signals AA$h$, 55$h$ and A0$h$ inputted through the data pin DQ are the program command. After the application of the program command, an address PA designating a memory cell to be programmed is inputted through the address pin ADDR, and data PD corresponding to the inputted address PA is inputted through the data pin DQ in synchronization with a data input enable signal WE#. When the address PA and the data PD are inputted, the memory device begins to perform a program operation to record the data PD in the memory cell designated by the address PA. In FIG. 1, a signal PGM is internally activated to a high level during the program operation. The data PD is recorded while the signal PGM is kept at the high level.

To confirm whether the program operation is completed, a status address STATUS_ADDR is inputted through the address pin ADDR. That is, the status address STATUS_ADDR is inputted for confirming whether the program operation inside the memory is completed. The memory outputs a status flag STATUS_FLAG through the data pin DQ in response to the input of the status address STATUS_ADDR. The status flag STATUS_FLAG contains information about whether the program operation inside the memory is completed. Since the program operation inside the memory is not completed while the first status flag STATUS_FLAG1 in FIG. 1 is being outputted, the first status flag STATUS_FLAG1 contains information indicating that the program operation is not completed. On the other hand, since the program operation is completed at the time when the second status flag STATUS_FLAG2 corresponding to the second status address STATUS_ADDR2 is outputted, the second status flag STATUS_FLAG2 contains information indicating that the program operation is completed.

According to the above-mentioned method, it is difficult to extract the accurate program time in a nonvolatile memory test. An approach to detecting the program time is to continuously request the status flag STATUS_FLAG and find a position where the value of the status flag STATUS_FLAG changes. Information that can be obtained by requesting the status flag STATUS_FLAG is merely information about whether the program operation inside the memory is completed. Hence, it is difficult to detect the exact time when the program is completed. In the case of FIG. 1, by requesting the status flag two times, it can be known that the program operation has been completed at the time between the request of the first status flag STATUS_FLAG1 and the request of the second status flag STATUS_FLAG2. However, it is difficult to detect the exact/accurate program end time in the duration 101 between two time points.

SUMMARY OF THE INVENTION

An embodiment of the present invention is directed to providing a nonvolatile memory device capable of measuring an exact program end time, and a method for operating the same.

In accordance with an aspect of the present invention, there is provided a nonvolatile memory device including a selecting unit configured to select one of a read data or a program signal indicating a program period; an output unit configured to output an output signal of the selecting unit to the outside of a chip; and an output pin connected to the output unit.

In accordance with another aspect of the present invention, there is provided a nonvolatile memory device including a selecting unit configured to output one of a read data and a program end signal activated upon completion of a program period; an output unit configured to output an output signal of the selecting unit to the outside of a chip; and an output pin connected to the output unit.

In accordance with another aspect of the present invention, there is provided a method for operating a nonvolatile memory device, the method including applying a program command; applying an address; applying data corresponding to the address; programming the data into a memory cell designated by the address; and outputting a program signal being activated during the program operation to the outside of the memory device.

In accordance with another aspect of the present invention, there is provided a method for operating a nonvolatile memory device, the method including applying a program command; applying an address; applying data corresponding to the address; programming the data into a memory cell designated by the address; and outputting a program end signal being activated upon completion of the program operation to the outside of the memory device.

DESCRIPTION OF SPECIFIC EMBODIMENTS

Other objects and advantages of the present invention can be understood by the following description, and become apparent with reference to the embodiments of the present invention.

Figure 1:
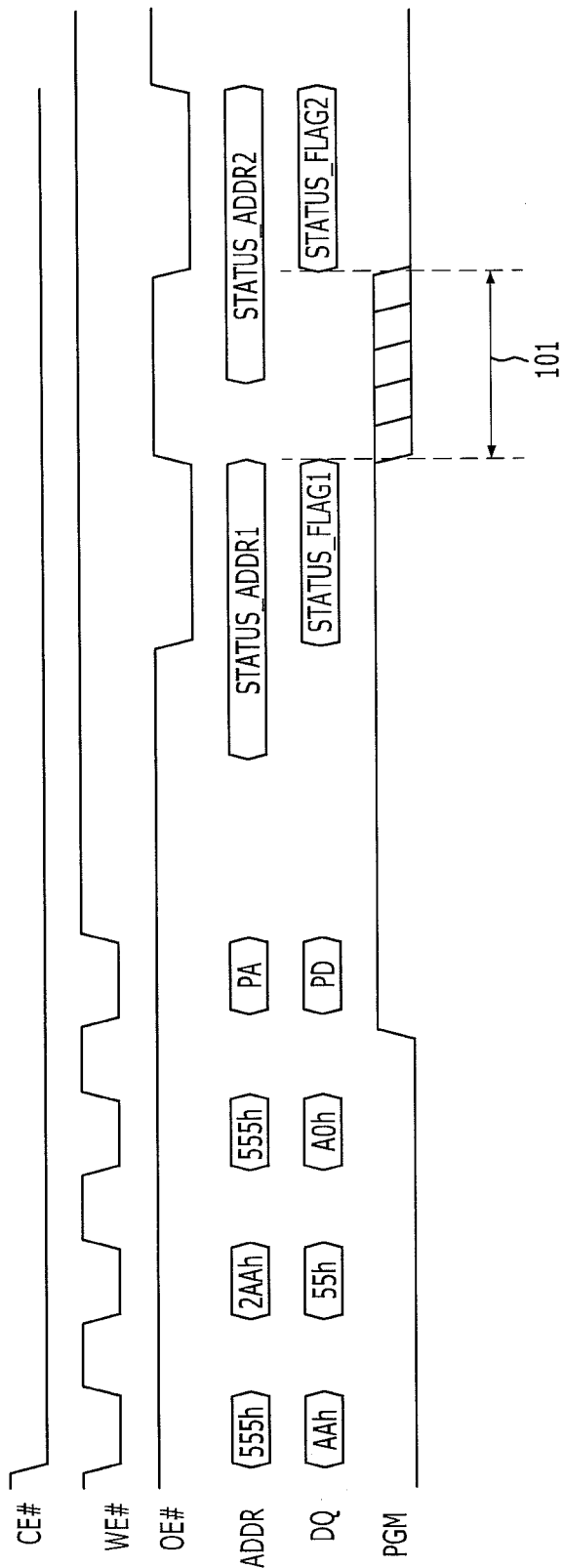
FIG. 1 is a timing diagram explaining a procedure of confirming whether a program operation is completed in a conventional nonvolatile memory device.
Figure 2:
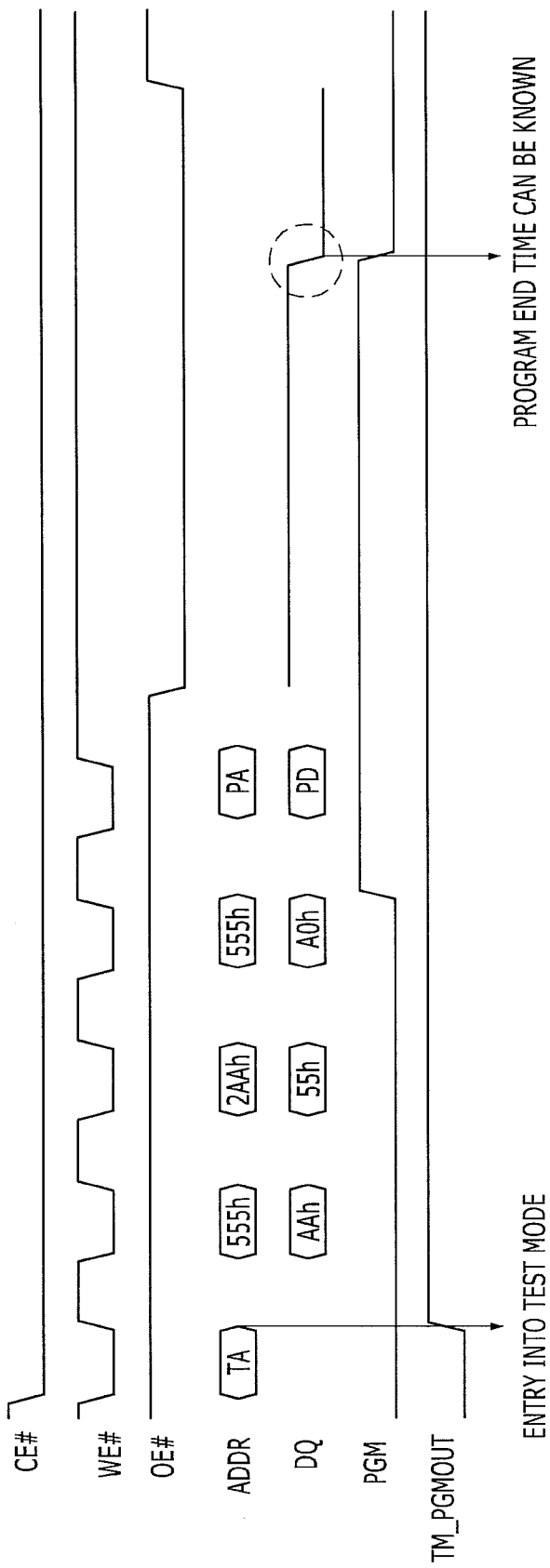
FIG. 2 is a timing diagram explaining a method for operating a nonvolatile memory device in accordance with an embodiment of the present invention.

FIG. 2 is a timing diagram explaining a method for operating a nonvolatile memory device in accordance with an embodiment of the present invention.

Referring to FIG. 2, a method for operating a nonvolatile memory in accordance with an embodiment of the present invention includes applying a program command, applying an address PA, applying data PD corresponding to the address PA, programming the data PD into a memory cell designated by the address PA, and outputting a program signal PGM being activated during the program operation to the outside of the memory device.

To enter a test mode for detecting a program time, an address TA setting the test mode is applied. Due to the application of the address TA, the memory device enters the test mode for detecting the program time. Although it is assumed in the current embodiment that the nonvolatile memory device performs the following operations under a condition that the test mode for detecting the program time is set, it is apparent that the nonvolatile memory device can also be designed to perform the following operations without setting the test mode. When the test mode is set, a signal TM_PGMOUT indicating that the test mode has been set is activated to a high level.

A program command is applied. To be specific, the program command is applied through an address pin ADDR and a data pin DQ for three cycles. That is, the first three signals 555h, 2AAh and 555h inputted through the address pin ADDR, and the first three signals AAh, 55h and A0h inputted through the data pin DQ are the program command.

After the application of the program command, an address PA designating a memory cell to be programmed is applied through the address pin ADDR, and data PD corresponding to the inputted address PA is applied through the data pin DQ. A period where a data input enable signal WE# is activated to a low level is a period where an external data is applied through the data pin DQ. Likewise, a period where a data output enable signal OE# is activated to a low level is a period where the memory device outputs the data through the data pin DQ to the outside the chip.

After the address PA designating the memory cell to be programmed and the data PD to be recorded in the designated memory cell are inputted, a program operation is performed to record the data PD into the memory cell of the memory device. The program signal PGM is activated to a high level while the program operation is performed inside the memory device, that is, the data are actually recorded in the memory cell. The program signal PGM is activated to a high level in response to the program command, and deactivated to a low level after completion of a verification operation that verifies whether the program operation inside the memory device is completed. In accordance with the embodiment of the present invention, the program signal PGM is outputted to the outside of the memory device. It can be seen from FIG. 2 that, after the address PA and the data PD are applied from the outside of the memory device in order for the program operation, the data output enable signal OE# is activated to a low level and the program signal PGM is outputted through the data pin DQ to the outside of the memory device. In this case, the output enable signal OE# is kept in the activated state being the low level without toggling. Thus, the program signal PGM is also outputted through the data pin DQ to the outside of the chip in an asynchronous mode, that is, continuously without regard to a clock. The moment when the program signal PGM outputted through the data pin DQ changes to a low level is the time point when the program operation is completed. At the outside of the memory device, the exact/accurate program end time can be known by detecting the moment when the program signal PGM changes to a low level.

Since the data pin DQ is not used while the program operation is performed in the memory device, there are no problems in other functions of the memory device even though the program signal PGM is outputted through the data pin DQ during that period.

Figure 3:
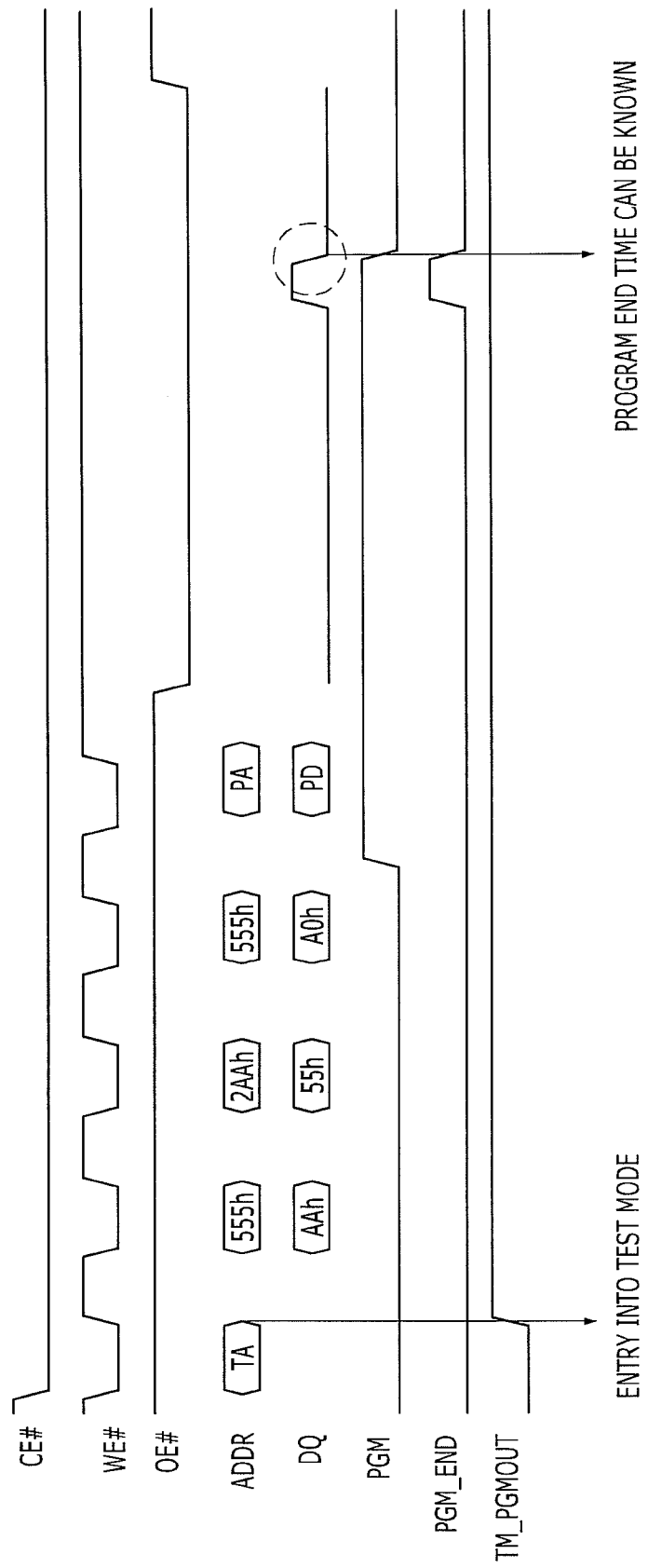
FIG. 3 is a timing diagram explaining a method for operating a nonvolatile memory device in accordance with another embodiment of the present invention.

FIG. 3 is a timing diagram explaining a method for operating a nonvolatile memory device in accordance with another embodiment of the present invention.

Referring to FIG. 3, a method for operating nonvolatile memory device in accordance with another embodiment of the present invention includes applying a program command, applying an address PA, applying data PD corresponding to the address PA, programming the data PD into a memory cell designated by the address PA, and outputting a program end signal being activated upon completion of the program operation to the outside of the memory device.

To enter a test mode for detecting a program time, an address TA setting the test mode is applied. Due to the application of the address TA, the memory device enters the test mode for detecting the program time. Although it is assumed in the current embodiment that the nonvolatile memory device performs the following operations under a condition that the test mode for detecting the program time is set, it is apparent that the nonvolatile memory device can also be designed to perform the following operations without setting the test mode. When the test mode is set, a signal TM_PGMOUT indicating that the test mode has been set is activated to a high level.

A program command is applied. To be specific, the program command is applied through an address pin ADDR and a data pin DQ for three cycles. That is, the first three signals 555h, 2AAh and 555h inputted through the address pin ADDR, and the first three signals AAh, 55h and A0h inputted through the data pin DQ are the program command.

After the application of the program command, an address PA designating a memory cell to be programmed is applied through the address pin ADDR, and data PD corresponding to the inputted address PA is applied through the data pin DQ. A period where a data input enable signal WE# is activated to a low level is a period where an external data is applied through the data pin DQ. Likewise, a period where a data output enable signal OE# is activated to a low level is a period where the memory device outputs the data through the data pin DQ to the outside the chip.

After the address PA designating the memory cell to be programmed and the data PD to be recorded in the designated memory cell are inputted, a program operation is performed to record the data PD into the memory cell of the memory device. The program signal PGM is activated to high level while the program operation is performed inside the memory device, that is, the data are actually recorded in the memory cell. A program end signal PGM_END is generated based on the program signal PGM. The program end signal PGM_END is a pulse signal that is activated in a period where the program signal PGM changes from a high level to a low level. The moment when the program end signal PGM_END is activated is a program end time. In accordance with the embodiment of FIG. 3, the program end signal PGM_END is outputted to the outside of the memory device. It can be seen from FIG. 3 that, after the address PA and the data PD are applied from the outside of the memory device in order for the program operation, the data output enable signal OE# is activated to a low level and the program end signal PGM_END is outputted through the data pin DQ to the outside of the memory device. In this case, the output enable signal OE# is kept in the activated state being the low level without toggling. Thus, the program end signal PGM_END is outputted through the data pin DQ to the outside of the chip in an asynchronous mode, that is, continuously without regard to a clock. The moment when the program end signal PGM_END outputted through the data pin DQ is activated is the time point when the program operation is completed. At the outside of the memory device, the exact program end time can be known by detecting the moment when the program end signal PGM_END is activated.

Figure 4:
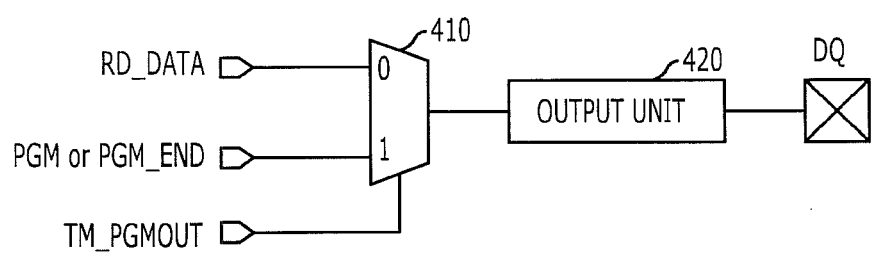
FIG. 4 illustrates a nonvolatile memory device in accordance with an embodiment of the present invention.

FIG. 4 illustrates a nonvolatile memory device in accordance with an embodiment of the present invention.

Referring to FIG. 4, the nonvolatile memory device in accordance with the embodiment of the present invention includes a selecting unit 410, an output unit 420, and an output pin DQ. The selecting unit 410 selectively outputs one of a read data RD_DATA and a program signal PGM (or a program end signal PGM_END) indicating a program period. The output unit 420 outputs an output signal of the selecting unit 410 to the outside of the chip. The output pin DQ is connected to the output unit 420.

In the case of FIG. 2, the selecting unit 410 outputs one of the program signal PGM and the read data RD_DATA. In the case of FIG. 3, the selecting unit 410 outputs one of the program end signal PGM_END and the read data RD_DATA. The following description will be made on the assumption that the selecting unit 410 outputs one of the program signal PGM and the read data RD_DATA.

In case where the test mode is set, that is, the signal TM_PGMOUT is activated, the selecting unit 410 outputs the program signal PGM. In case where the test mode is not set, that is, the signal TM_PGMOUT is deactivated, the selecting unit 410 outputs the read data RD_DATA instead of the program signal PGM. This exemplary configuration of the nonvolatile memory device is designed to perform the operation of FIG. 2 or 3 in case where the test mode for detecting the program time is set. However, even though the test mode is not set, the nonvolatile memory device can also be designed to perform the operation of FIG. 2 or 3. In this case, the selecting unit 410 may be controlled by using a signal that is activated until before other command is applied after the application of the program command.

The output unit 420 outputs the internal data of the memory device to the outside of the chip. If the read data RD_DATA is outputted from the selecting unit 410, the output unit 420 outputs the read data RD_DATA to the outside of the chip. If the program signal PGM is outputted from the selecting unit 410, the output unit 420 outputs the program signal PGM to the outside of the chip. In this way, the exact program end time can be detected at the outside of the memory device. The output unit 420 is operated during a period where the data output enable signal OE# is activated to a low level.

The nonvolatile memory device in accordance with the embodiment of the present invention operates in such a manner as explained above with reference to FIGS. 2 and 3. As a result, the exact program end time can be detected at the outside of the memory device.

The nonvolatile memory devices in accordance with the embodiments of the present invention can output the signal containing information about the program period to the outside of the chip. Therefore, the time necessary for the program operation can be accurately measured.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
   a selecting unit configured to select one of a read data and a program signal indicating a program period for writing data, wherein the program signal is activated during a program operation;
   an output unit configured to output an output signal of the selecting unit to the outside of a chip; and
   an output pin connected to the output unit,
   wherein the selecting unit is configured to output the program signal when a test mode for detecting a program time is set.

2. The nonvolatile memory device of claim 1, wherein the program signal is continuously activated in response to a program command until the program signal is inactivated after completion of a program verification operation and the activation and deactivation are asynchronous without reference to any clock.

3. A nonvolatile memory device, comprising:
   a selecting unit configured to output one of a read data and a program end signal activated upon completion of a program period for writing data, wherein the program signal is activated during a program operation;
   an output unit configured to output an output signal of the selecting unit to the outside of a chip; and
   an output pin connected to the output unit.
   wherein the selecting unit is configured to output the program end signal when a test mode for detecting a program time is set.

4. A nonvolatile memory device, comprising:
   a selecting unit configured to select one of a read data or a program signal indicating a program period for writing data;
   an output unit configured to output an output signal of the selecting unit to the outside of a chip; and
   an output pin connected to the output unit,
   wherein the program signal is continuously activated in response to a program command until the program signal is inactivated after completion of a program verification operation and the activation and deactivation are asynchronous without reference to any clock.

5. The nonvolatile memory device of claim 4, wherein the selecting unit is configured to output the program signal when a test mode for detecting a program time is set.

* * * * *